United States Patent
Inomata

(10) Patent No.: US 7,688,096 B2
(45) Date of Patent: Mar. 30, 2010

(54) CONTACT LOAD MEASURING APPARATUS AND INSPECTING APPARATUS

(75) Inventor: Isamu Inomata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 519 days.

(21) Appl. No.: 11/659,085

(22) PCT Filed: Jul. 28, 2005

(86) PCT No.: PCT/JP2005/013826

§ 371 (c)(1),
(2), (4) Date: Feb. 1, 2007

(87) PCT Pub. No.: WO2006/013773

PCT Pub. Date: Feb. 9, 2006

(65) Prior Publication Data

US 2009/0039903 A1    Feb. 12, 2009

(30) Foreign Application Priority Data

Aug. 2, 2004 (JP) .............................. 2004-226149

(51) Int. Cl.
*G01R 31/02* (2006.01)
(52) U.S. Cl. ...................................... 324/758; 324/662
(58) Field of Classification Search ................. 324/754, 324/758, 765, 158.1
See application file for complete search history.

(56) References Cited

U.S. PATENT DOCUMENTS

| | | | |
|---|---|---|---|
| 6,501,289 B1 * | 12/2002 | Takekoshi | 324/758 |
| 6,650,135 B1 * | 11/2003 | Mautz et al. | 324/765 |
| 7,068,056 B1 * | 6/2006 | Gibbs et al. | 324/754 |
| 7,235,984 B2 * | 6/2007 | Honma | 324/662 |
| 2001/0054892 A1 * | 12/2001 | Takekoshi | 324/158.1 |

FOREIGN PATENT DOCUMENTS

| | | |
|---|---|---|
| JP | 10 150081 | 6/1998 |
| JP | 2003 50271 | 2/2003 |
| JP | 2003 065864 | 3/2003 |
| JP | 2003 168707 | 6/2003 |
| JP | 2003 185704 | 7/2003 |

\* cited by examiner

*Primary Examiner*—Ha Tran T Nguyen
*Assistant Examiner*—Arleen M Vazquez
(74) *Attorney, Agent, or Firm*—Oblon, Spivak, McClelland, Maier & Neustadt, L.L.P.

(57) ABSTRACT

An inspecting apparatus is provided for inspecting electrical characteristics of an object (W) to be inspected, such as a semiconductor wafer. The inspecting apparatus is provided with a placing table (11) for supporting the object, a lift mechanism (12) for bringing up and down the placing table, and a driving apparatus (24) for driving the lift mechanism. The apparatus is also provided with a probe (13A) which makes contact with the object on the placing table brought up by the lift mechanism driven by the driving apparatus, and a load sensor (21), including a compression-type piezoelectric element, for detecting a contact load between the object and the probe as an oscillation waveform.

4 Claims, 3 Drawing Sheets

CONTACT LOAD MEASURING APPARATUS AND INSPECTING APPARATUS

FIELD OF THE INVENTION

The present invention relates to a contact load measuring apparatus and an inspecting apparatus for measuring a contact load between an object to be inspected and a probe during the course of inspecting electrical properties of an object such as a semiconductor wafer.

BACKGROUND OF THE INVENTION

This type of inspecting apparatus is provided with, e.g., a loader chamber in which a wafer as an object to be inspected is conveyed; and a prober chamber for transferring the wafer from and to the loader chamber, wherein the electrical properties of the wafer are inspected within the prober chamber. Provided inside the prober chamber are a mounting table that holds the wafer in place; and a lift mechanism that raises and lowers the mounting table. Further provided within the prober chamber are a probe arranged above the mounting table; and an alignment mechanism that aligns the locations of the probe and the wafer.

In case of inspecting the wafer in the prober chamber, the alignment mechanism is used to align the wafer on the mounting table with the probe. The mounting table is then raised up with the lift mechanism to bring the wafer and the probe into contact with each other. Thereafter, the mounting table is moved up by a specific overdriving amount and the electrical properties of the wafer are inspected while the wafer remains in contact with the probe.

Overdriving the mounting table on this occasion allows the inspection to be performed in a state that the wafer and the probe make contact with each other at a specified contact load. Because of this contact load, a probe card that supports the probe may be bent or the mounting table may be sunk down. For this reason, even if the mounting table is moved up by an exact overdriving amount, the wafer and the probe may fail to contact with each other at a desired contact load.

In view of this, techniques of finding out such a contact load have been proposed in Japanese Application Publication Nos. 2003-050271 and 2003-168707.

First of all, Japanese Application Publication No. 2003-050271 discloses an apparatus for measuring properties of a probe card. This device is adapted to measure the properties of the probe card, which supports a probe, while electrical properties of an object are inspected by raising up a mounting table and bringing the probe into contact with the object on the mounting table. This device includes a load sensor that detects a load applied by the probe card against the mounting table; and a displacement sensor that detects an absolute displacement of the probe card. With this configuration, it is possible to accurately grasp the relationship between an overdriving amount of the mounting table and a resultant load by measuring the absolute displacement of the probe card.

Further, Japanese Application Publication No. 2003-168707 discloses a probe apparatus provided with a contact load monitoring device. The contact load monitoring device is adapted to monitor a contact load by referring to a sinking amount of a mounting table attributable to the contact load applied on the mounting table by a probe during overdriving. Specifically, the contact load monitoring device is provided with a displacement sensor that measures a sinking amount based on a displacement of an undersurface of the mounting table from a reference surface. With this configuration, it is possible to constantly secure the contact load with no deformation of the sensor by monitoring the contact load based on the sinking amount of the mounting table at the time of inspection.

In the meantime, Japanese Patent No. 3128354 discloses an electronic part mounting device. This device includes a head mechanism for holding an electronic part and a head lift mechanism for bringing up and down the head mechanism with respect to a printed circuit board supported by a board lift mechanism. The board lift mechanism is provided with a plurality of supporting pins that supports the printed circuit board. The supporting pins are provided with force sensors that measure a pressing force borne by the respective pins during mounting the electronic part. The operation of the head lift mechanism is controlled by detection signals of the force sensors, so that the electronic part can be pressed against the printed circuit board with a specified pressing force.

However, the techniques described in Japanese Application Publication Nos. 2003-050271 and 2003-168707 are adapted to measure the contact load or the displacement of the mounting table by using a load sensor, such as a load cell or a displacement sensor; and to calculate the relationship between the contact load and the overdriving amount based on the values thus measured. For this reason, when the contact load is applied, the mounting table may be tilted or sunk down, or the sensors may be deformed by the load weight. This may cause to generate an error in the displacement of the mounting table, thereby making it difficult to accurately detect the contact load and to directly measure the contact load.

On the other hand, the apparatus taught in Japanese Patent No. 3128354 makes use of, e.g., a strain gauge or a piezoelectric sensor as the force sensors for detecting the pressing force. In this case, the force sensors need to be provided in multiple numbers on the supporting pins, and the pressing force of the head mechanism needs to be calculated by summing up individual pressing forces applied to the respective force sensors. Further, the forces detected by the force sensors are as small in magnitude as the force required in mounting the electronic part to the printed circuit board, and the influence of individual components' deformation cannot be taken into account.

DISCLOSURE OF THE INVENTION

The present invention has been conceived to solve the problems noted above, and it is an object of the present invention to provide a contact load measuring apparatus and an inspecting apparatus capable of directly measuring a contact load with a high accuracy while suppressing the deformation of a load sensor caused by the contact load so as not to affect the inspection.

To achieve the object, in accordance with the present invention, there is provided a contact load measuring apparatus that measures a contact load between an object to be inspected and a probe while electrical properties of the object are inspected by bringing the probe into contact with the object supported on an elevatable mounting table, including a load sensor that detects the contact load, the load sensor including a compression-type piezoelectric element.

With this contact load measuring apparatus, it is possible to directly measure the contact load with a high accuracy while suppressing the deformation of the load sensor caused by the contact load so as not to affect the inspection.

Further, in accordance with the present invention, there is provided an inspecting apparatus that inspects electrical properties of an object to be inspected, including a mounting table for supporting the object; a lift mechanism for raising and lowering the mounting table; a driving unit for driving the lift mechanism; a probe for making contact with the object on the mounting table raised up by means of the lift mechanism driven by the driving unit; and a load sensor that detects a contact load between the object and the probe, the load sensor including a compression-type piezoelectric element.

With this inspecting apparatus, it is possible to directly measure the contact load with a high accuracy while realizing a structure of increased rigidity and suppressing the deformation of the load sensor caused by the contact load so as not to affect the inspection.

In the contact load measuring apparatus and the inspecting apparatus, the compression-type piezoelectric element that functions as the load sensor can detect the contact load as an oscillation waveform.

It is preferable that the inspecting apparatus further includes an antiphase signal generator that generates an antiphase electrical signal having a waveform opposite in phase to the oscillation waveform, wherein the driving unit drives the lift mechanism in response to the antiphase signal generated by the antiphase signal generator. This makes it possible to dampen vibration of the mounting table which would occur when the contact load is generated, thereby stopping the mounting table within a shortened period of time to stabilize it. Thus, it becomes possible to increase the throughput of inspection.

In the inspecting apparatus, it is preferable that the load sensor is preloaded.

DETAILED DESCRIPTION OF THE EMBODIMENTS

Hereinafter, the present invention will be described based on the embodiments shown in the accompanying drawings.

Figure 1:
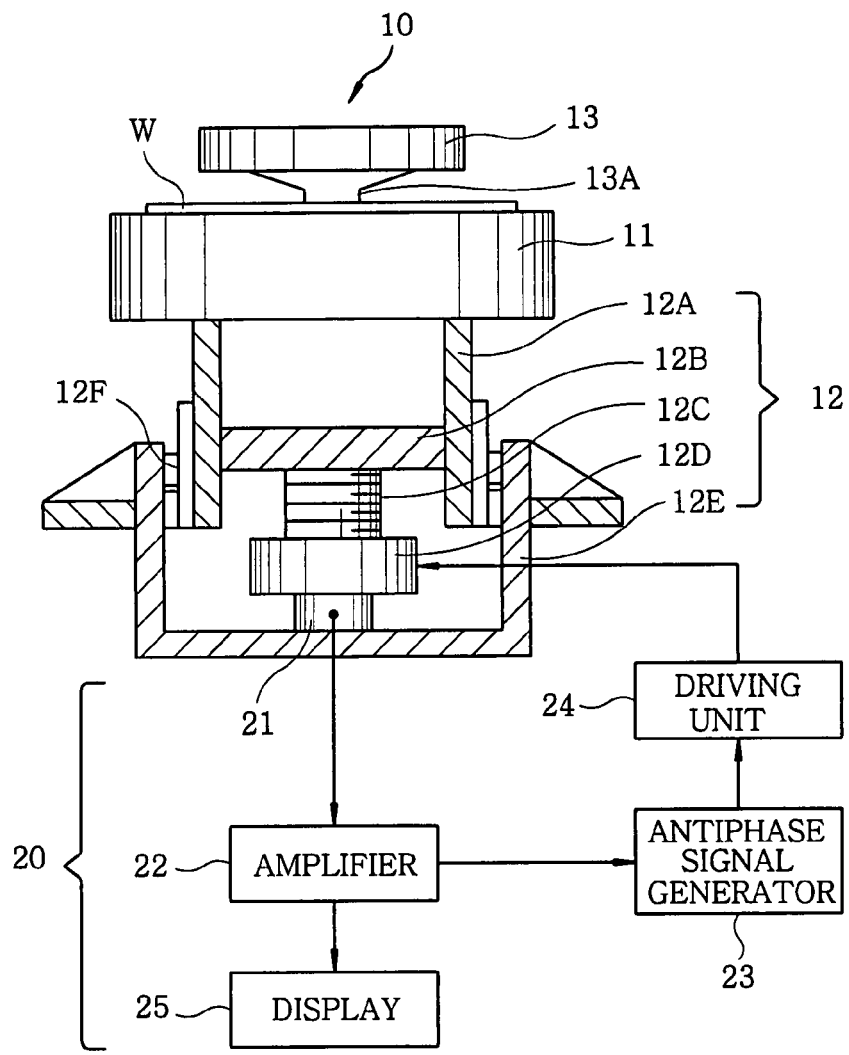
FIG. 1 is a schematic view showing one embodiment of an inspecting apparatus in accordance with the present invention.

An inspecting apparatus 10 shown in FIG. 1 includes an elevatable cylindrical mounting table 11 that supports a semiconductor wafer W as an object to be inspected. The inspecting apparatus 10 further includes a lift mechanism 12 for raising and lowering the mounting table 11; and a driving unit 24 for driving the lift mechanism 12. Arranged above the mounting table 11 is a probe card 13 having probes 13A. The inspecting apparatus 10 has a relatively high structural rigidity and is configured to inspect electrical properties of the wafer W by bringing the probes 13A and the wafer W into electrical contact under the control of a controller (not shown).

The mounting table 11 is installed on an XY stage (not shown), for example. The XY stage is movable within a horizontal plane in X- and Y-directions orthogonal to each other. Horizontal positions of the wafer W on the mounting table 11 and the probes 13A of the probe card 13 are aligned by an alignment mechanism (not shown) as the XY stage is moved in the X- and Y-directions under the control of the controller. Further, the mounting table 11 is raised up toward the probes 13A by means of the lift mechanism 12 until fulfillment of a specific overdriving amount, whereby the wafer W and the probes 13A are brought into contact with each other at a specified contact load (probe pressure), and electrical properties of the wafer W is inspected.

The lift mechanism 12 has a ball screw 12C arranged in a concentric relationship with the mounting table 11. The ball screw 12C is connected through a coupling member 12B to a bottom center portion of a hollow cylindrical body 12A attached to an undersurface of the mounting table 11. Also provided are a bearing member 12D that rotatably supports the ball screw 12C and a supporting body 12E of a bottom-closed hollow cylinder shape that encloses the hollow cylindrical body 12A. In between the hollow cylindrical body 12A and the supporting body 12E, there is provided a guide mechanism 12F for movably guiding the hollow cylindrical body 12A in a vertical direction within the supporting body 12E. The mounting table 11 is attached to the XY stage through the hollow cylindrical body 12A and the supporting body 12E. The lift mechanism 12 is placed on the XY stage in such a manner that it can raise and lower the mounting table 11 in concert with rotation of the ball screw 12C.

Next, the inspecting apparatus 10 is provided with a contact load measuring apparatus 20. The measuring apparatus 20 includes a load sensor 21, an amplifier (e.g., a charge amplifier) 22 connected to the sensor 21 and a display 25 connected to the amplifier 22.

The load sensor 21 is provided between the bearing member 12D and the supporting body 12E of the lift mechanism 12 and is adapted to detect a contact load as an oscillation waveform. The load sensor 21 includes a compression-type piezoelectric element (e.g., a quartz element). The load sensor 21 has a rigidity great enough to ensure that it undergoes substantially no deformation even under a high contact load, causes no sinking-down of the mounting table 11 and becomes no major cause of measurement errors. The load sensor 21 produces electric charges in proportion to the acceleration based on the contact load. Further, the amplifier 22 converts the detection signal of the load sensor 21 to a voltage signal and amplifies the voltage signal. The amplified voltage signal is displayed on the display 25.

Further, the inspecting apparatus 10 includes an antiphase signal generator (e.g., an antiphase amplifier) 23 connected to the amplifier 22 and the driving unit 24. Based on the voltage signal from the amplifier 22, the antiphase signal generator 23 generates an antiphase signal (antiphase voltage signal), i.e., an electrical signal whose waveform has a phase opposite to that of an oscillation waveform of the voltage signal. Further, the driving unit 24 rotates the ball screw 12C in the lift mechanism 12 in response to the antiphase signal generated by the antiphase signal generator 23.

Accordingly, with this inspecting apparatus 10, the mounting table 11 is raised up by means of the lift mechanism 12 to allow the wafer W on the mounting table 11 to make contact with the probes 13A in the first place. Then, if a contact load is exerted between the wafer W and the probes 13A by a further upward movement (overdrive) of the mounting table 11, the contact load is directly transmitted from the mounting table 11 to the load sensor 21 through the lift mechanism 12.

Figure 2:
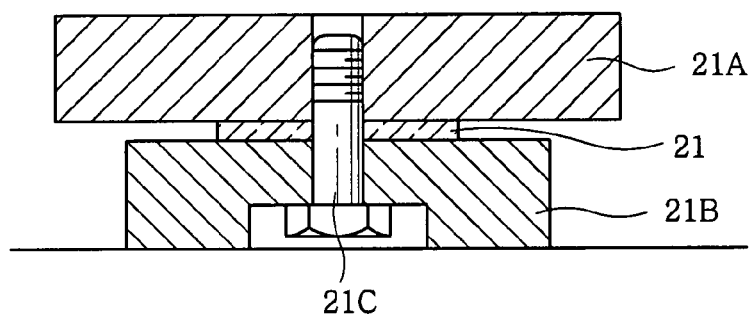
FIG. 2 is a sectional view enlargedly showing major parts of the contact load measuring apparatus shown in FIG. 1.

As illustrated in FIG. 2 for instance, the load sensor 21 is arranged between an upper plate 21A (which is equivalent to the bearing member 12D in the present embodiment) and the lower plate 21B (which is equivalent to a bottom wall portion of the supporting body 12E in the present embodiment).

Further, the load sensor 21 is preloaded at a specific pressure by means of a preloading bolt 21C that tightens the upper plate 21A and the lower plate 21B together. Preloading the load sensor 21 in this manner makes it possible to conduct highly accurate measurement within a range of good linearity, avoiding a range of bad linearity under the condition of low load.

Figure 3A:
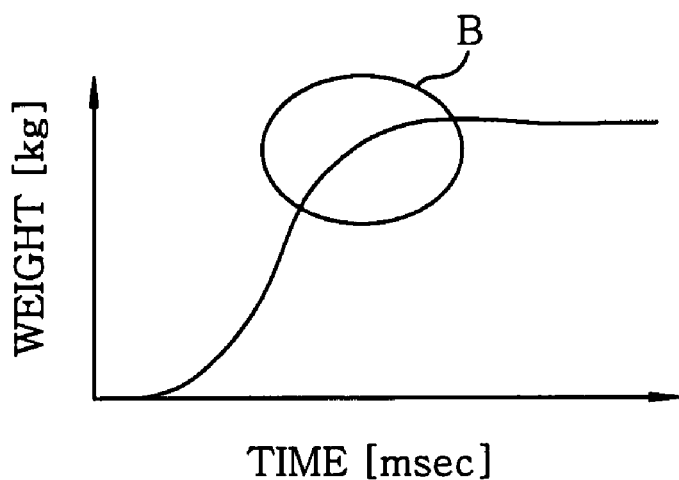
FIG. 3A is a graph illustrating a contact load obtained by the measuring apparatus depicted in FIG. 2.
Figure 3B:
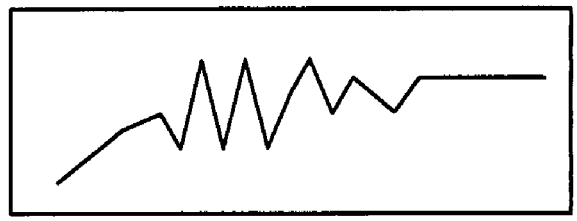
FIG. 3B is a graph enlargedly showing the section indicated by "B" in FIG. 3A.

Further, due to the fact that the load sensor 21 is constructed from a preloaded compression-type piezoelectric element as set forth above, not only the pressing force but also a tensile force can be detected by the load sensor 21. If the mounting table 11 is overdriven during the inspection of the wafer W to thereby increase the contact load over time as illustrated in FIG. 3A, the contact load shows an oscillation waveform with repetition of minute rises and falls as depicted in FIG. 3B. This oscillation waveform can be detected by the load sensor 21.

Furthermore, if the load sensor 21 includes, e.g., a quartz element as the compression-type piezoelectric element, it exhibits good linearity against the contact load and shows no hysteresis, which makes it possible to obtain a detected load with increased resolution power. Moreover, the load sensor 21 of this type is simple in structure, excellent in attachability, small in size and high in rigidity, it can remarkably suppress any influence caused by the sinking amount of the mounting table 11.

The driving unit 24 includes a motor for rotating the ball screw 12C of the lift mechanism 12 and a driver circuit for driving the motor. Herein, the driver circuit drives the motor in response to the antiphase signal from the antiphase signal generator 23, whereby the mounting table 11 is given vibration having a waveform of an opposite phase to that of the oscillation waveform of the contact load. This dampens vibration of the mounting table 11, thereby stopping the mounting table 11 to stabilize it within a shortened period of time and eventually increasing the throughput of inspection.

Next, description will be given to the operation of the inspecting apparatus 10 of the present embodiment. The wafer W as an object to be inspected is first placed on the mounting table 11. Then, while the mounting table 11 is moved by means of the XY table, the alignment mechanism performs a task of aligning the wafer W with the probes 13A of the probe card 13. After the alignment has been completed, the mounting table 11 is moved by the XY table to bring the wafer W into a position just below the probe card 13. In this state, the lift mechanism 12 is driven by the driving unit 24 to raise the mounting table 11.

By the upward movement of the mounting table 11, the wafer W and the probes 13A are first brought into contact with each other as shown in FIG. 1. Subsequently, as the mounting table 11 is moved upward (overdriven), a contact load begins to be developed between the wafer W and the probes 13A. The contact load is directly applied to the load sensor 21 through the hollow cylindrical body 12A, the coupling member 12B, the ball screw 12C and the bearing member 12D of the lift mechanism 12. The load sensor 21 continually detects the contact load developed by the overdrive operation, the result of which is amplified by the amplifier 22 and displayed on the display 25 as illustrated in FIG. 3A. If the contact load becomes greater and the overdriving amount of the mounting table 11 comes closer to a specific value, the mounting table 11 which is moving upward by the ball screw 12C undergoes a small magnitude of vibration. The load sensor 21 detects the small magnitude of vibration as an oscillation waveform illustrated in FIG. 3B.

During the course of overdriving the mounting table 11, the signal detected by the load sensor 21 is transmitted from the amplifier 22 to the driving unit 24 via the antiphase signal generator 23. Responsive to the antiphase signal from the antiphase signal generator 23, the driving unit 24 rotates the ball screw 12C of the lift mechanism 12, thus dampening the vibration of the mounting table 11 and stopping the mounting table 11 within a short period of time. In this state, electrical properties of the wafer W are inspected by way of the probes 13A.

In accordance with the present embodiment as set forth above, the load sensor 21 of increased rigidity is provided to detect the contact load between the wafer W and the probes 13A as an oscillation waveform. This makes it possible to directly measure the contact load with a high accuracy while suppressing the deformation of a load sensor caused by the contact load so as not to affect the inspection.

Furthermore, with the present embodiment, the driving unit 24 is adapted to drive the lift mechanism 12 in response to the antiphase signal generated by the antiphase signal generator 23. This makes it possible to dampen vibration of the mounting table 11, thereby stopping the mounting table 11 to stabilize it within a shortened period of time. Thus, it becomes possible to increase the throughput of inspection.

Moreover, with the present embodiment, the signal from the load sensor 21 is used to directly control the driving unit 24, thereby assuring quick control of the lift mechanism 12. This makes it possible to stop the mounting table 11 to stabilize it within an even short period of time.

In addition, with the present embodiment, inasmuch as the load sensor 21 remains preloaded, a range of bad linearity can be avoided under the condition of low load, so that a highly accurate measurement can be conducted within a range of good linearity.

Figure 4:
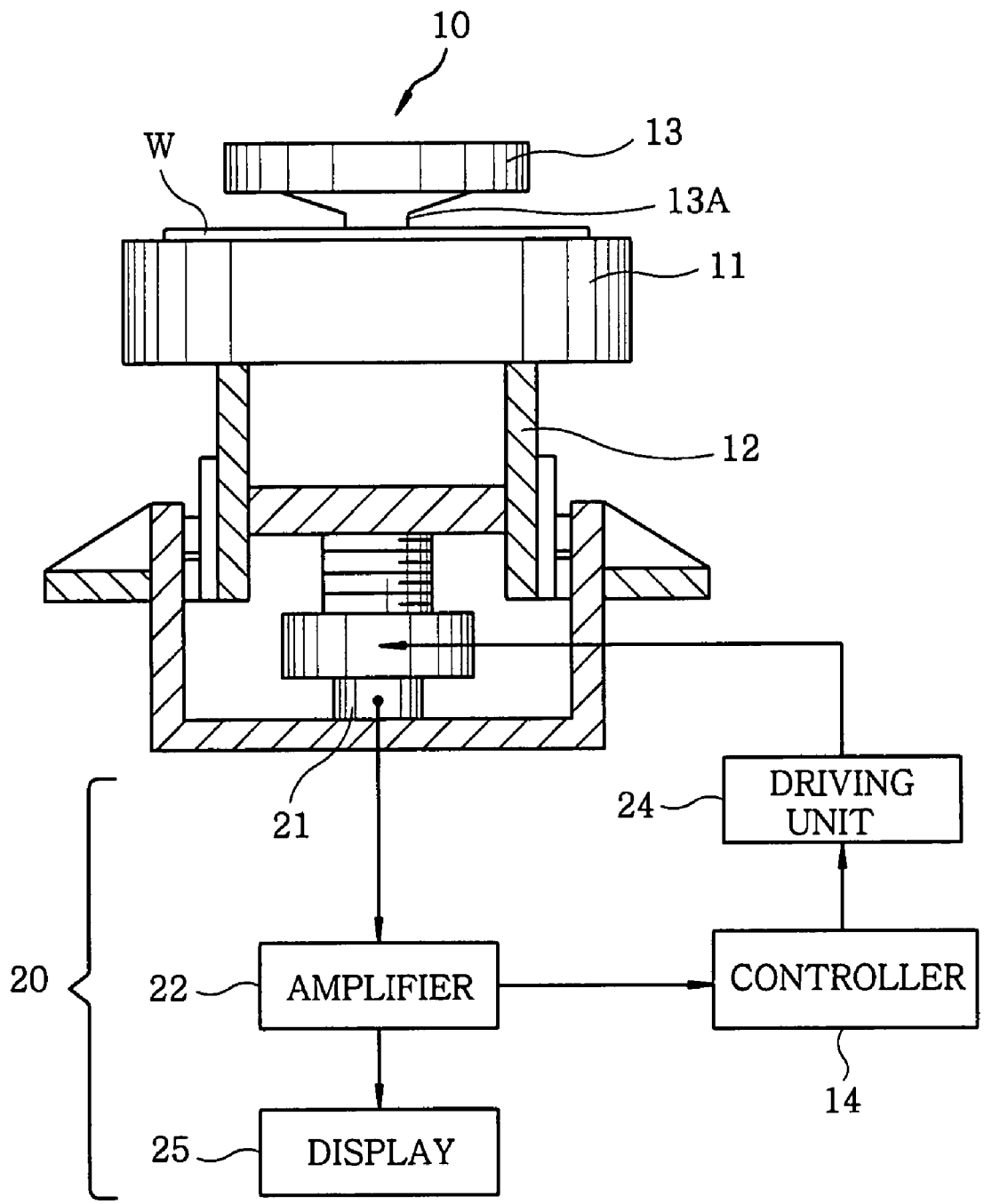
FIG. 4 is a schematic view showing another embodiment of an inspecting apparatus in accordance with the present invention.

Referring to FIG. 4, there is shown an inspecting apparatus in accordance with another embodiment of the present invention.

The inspecting apparatus 10 shown in FIG. 4 is constructed such that the detection signal of the load sensor 21 converted and amplified in the amplifier 22 is first transmitted to a controller 14 and the driving unit 24 is controlled by the controller 14. Other configurations than this are substantially the same as those of the preceding embodiment shown in FIGS. 1 and 2.

The controller 14 of the present embodiment includes the antiphase signal generator 23 as shown in FIG. 1 for example and controls the driver circuit of the driving unit 24 according to the antiphase signal generated by the antiphase signal generator 23.

In the present embodiment, the signal from the load sensor 21 is first transmitted to the controller 14 and the driving unit 24 is controlled by the controller 14. For this reason, it becomes difficult to quickly control the lift mechanism 12 as compared to the preceding embodiment in which the driving unit 24 is directly controlled in response to the signal of the load sensor 21. In other respects, the present embodiment can provide the same advantages in operation as those of the preceding embodiment.

The present invention is not limited to the foregoing embodiments at all. For example, although the above description is directed to a case of using the quartz element as the load sensor, a piezoelectric element formed of conventionally known ceramics, such as lead zirconate titanate and lead zirconate, may be used in place of the quartz element. Furthermore, while the wafer W has been taken as an example of the object to be inspected in the foregoing embodiments, the present invention may be applied to an object such as a liquid crystal substrate.

What is claimed is:

1. A contact load measuring apparatus that measures a contact load between an object to be inspected and a probe while electrical properties of the object are inspected by bringing the probe into contact with the object supported on an elevatable mounting table, comprising:
   a load sensor that detects the contact load, the load sensor including a compression-type piezoelectric element,
   wherein the load sensor detects the contact load as an oscillation waveform, and
   wherein the contact load measuring apparatus further comprises an antiphase signal generator that generates an antiphase electrical signal having a waveform opposite in phase to the oscillation waveform and a driving unit for raising or lowering the elevatable mounting table in response to the antiphase signal generated by the antiphase signal generator.

2. The contact load measuring apparatus of claim 1, wherein the load sensor is preloaded.

3. An inspecting apparatus that inspects electrical properties of an object to be inspected, comprising:
   a mounting table for supporting the object;
   a lift mechanism for raising and lowering the mounting table;
   a driving unit for driving the lift mechanism;
   a probe for making contact with the object on the mounting table raised up by means of the lift mechanism driven by the driving unit; and
   a load sensor that detects a contact load between the object and the probe, the load sensor including a compression-type piezoelectric element,
   wherein the load sensor detects the contact load as an oscillation waveform, and
   wherein the inspecting apparatus further comprises an antiphase signal generator that generates an antiphase electrical signal having a waveform opposite in phase to the oscillation waveform, and the driving unit drives the lift mechanism in response to the antiphase signal generated by the antiphase signal generator.

4. The inspecting apparatus of claim 3, wherein the load sensor is preloaded.

* * * * *